United States Patent [19]

Crain et al.

[11] 4,406,944
[45] Sep. 27, 1983

[54] DEVICES FOR MOUNTING INFRARED LAMPS IN FURNACES

[75] Inventors: N. Robert Crain, Huntington Beach; Robert P. Hardison, Tustin, both of Calif.

[73] Assignee: Radiant Technology Corp., Cerritos, Calif.

[21] Appl. No.: 246,235

[22] Filed: Mar. 23, 1981

[51] Int. Cl.³ .................. F27D 11/02; F27B 9/06
[52] U.S. Cl. .................. 219/388; 219/351; 219/354; 219/411; 219/541; 219/553; 219/408
[58] Field of Search .................. 219/339–358, 219/377, 388, 390, 405, 408, 411, 541, 552, 553, 524

[56] References Cited

U.S. PATENT DOCUMENTS

| | | | |
|---|---|---|---|
| 1,829,290 | 10/1931 | Merrill | 219/388 |
| 2,677,748 | 5/1954 | Naylor | 219/354 X |
| 2,954,826 | 10/1960 | Sievers | 219/354 X |
| 2,981,819 | 4/1961 | Gregory | 219/347 X |
| 3,204,085 | 8/1965 | Busby, Jr. | 219/346 |
| 3,436,524 | 4/1969 | Pauls | 219/347 |
| 3,714,885 | 2/1973 | Wertheimer et al. | 99/425 |
| 4,182,928 | 1/1980 | Murphy et al. | 174/153 R |

Primary Examiner—Volodymyr Y. Mayewsky
Attorney, Agent, or Firm—Christie, Parker & Hale

[57] ABSTRACT

Mounting devices are provided for mounting the end portions of a replaceable infrared lamp on the sidewalls of heating chamber formed of a compressed insulation material with sheet metal covers on the outer surface thereof. Each mounting device comprises a ceramic holder having a hollow cylindrical body with a shoulder on the outer end thereof and a bottom wall on the inner end thereof. The bottom wall has a concentric circular opening with diametrically disposed notches. One of the ceramic holders is positioned in each of a pair of opposing holes in the sidewalls with its shoulder secured to the sheet metal cover by a sealant. The lamp is held with its end portions extending through the circular openings in the bottom walls of the ceramic holders so that the metal terminals of the lamp protrude outside the sidewalls. A gasket formed of a resilient refractory material is positioned on each of the end portions of the infrared lamp and tightly packed within the cylindrical body of the ceramic holder so as to provide a gastight joint.

13 Claims, 9 Drawing Figures

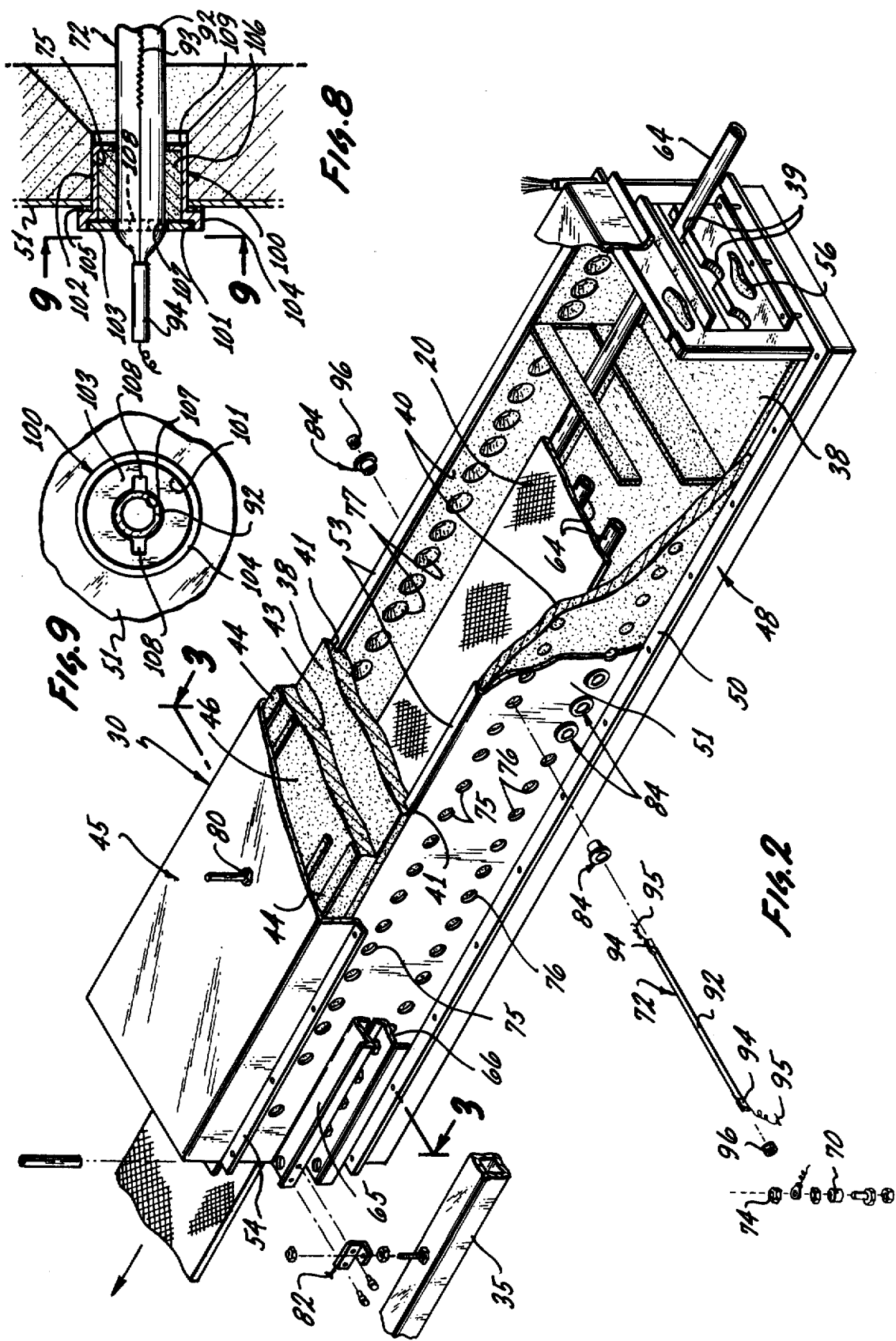

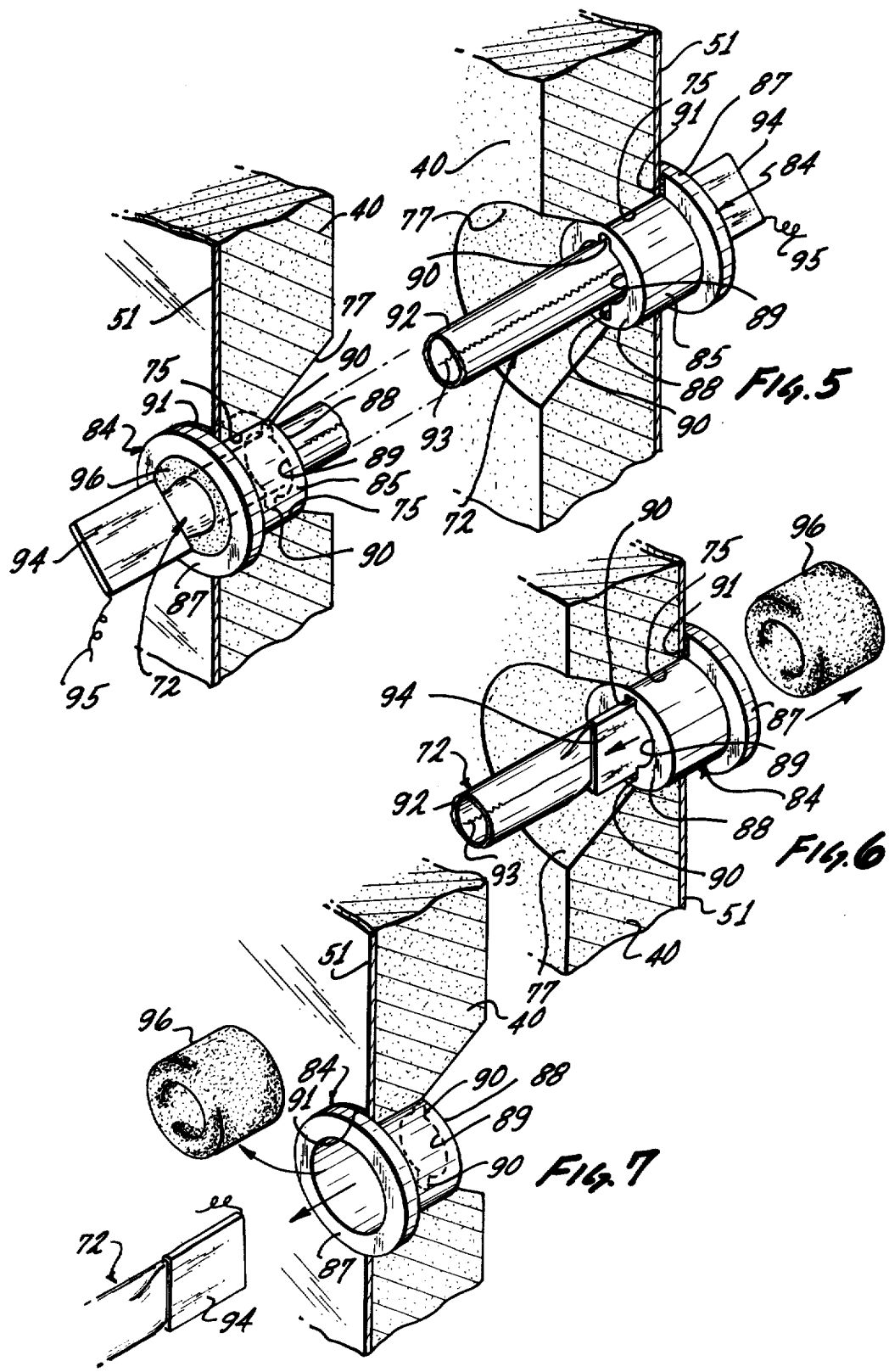

DEVICES FOR MOUNTING INFRARED LAMPS IN FURNACES

BACKGROUND OF THE INVENTION

The present invention relates to infrared furnaces and more particularly to devices for mounting infrared lamps in the heating chamber of such a furnace.

An infrared furnace provided with an endless conveyor belt is highly useful since transversely disposed infrared lamps located at different zones along the length of the heating chamber of the furnace can be quickly heated up as needed to give desired temperature profile in the direction of travel of the conveyor belt.

An infrared furnace of this type that is particularly advantageous comprises an elongated heating chamber having a rectangular cross section with its walls constructed of compressed, high temperature, porous insulation. A thin sheet metal housing or casing is provided to structurally hold the walls of the insulation together. Within the heating chamber, a first series of transversely disposed infrared lamps is provided above the conveyor belt and a second series of transversely disposed infrared lamps is provided below the conveyor belt. Plenum chambers on the top and bottom of the heating chamber enable a pressurized cover gas to slowly filter through the upper and lower walls of porous insulation material into the interior of the heating chamber. Such an infrared furnace is disclosed in a copending patent application of N. Robert Crain et al, Ser. No. 119,496, filed Feb. 7, 1980.

In such an infrared furnace, it is desirable to provide for mounting the infrared lamps so that the metal terminals on the ends of the quartz tube thereof protrude outside the sidewalls of the heating chamber so that they can be cooled by cooling air. It should be appreciated that inasmuch as a plurality of infrared lamps are used in such a heating chamber, a large number of pairs of mounting devices are provided on the sidewalls thereof. Thus, it is desirable to provide for the end portions of the infrared lamps to be held in the mounting devices in a substantially gastight manner so that air or any other gases will not readily seep into or out of the heating chamber at these points. Still further, it is highly desirable to mount the infrared lamps on the sidewalls of the heating chamber so that each can be individually readily replaced in the event it burns out.

SUMMARY OF THE INVENTION

In accordance with the present invention, a ceramic holder having a hollow cylindrical body is positioned with a close fit in each of the holes provided on the sidewalls of the heating chamber of the infrared furnace. Each ceramic holder has a shoulder on the outer end thereof and a bottom wall on the inner end thereof. The bottom wall has a concentric circular opening therein in which an end portion of the quartz tube of an infrared lamp has a close fit. Inasmuch as the quartz tube of the infrared lamp has flat rectangular metal terminals on the ends thereof which are wider than the diameter of the quartz tube, the circular opening on the bottom of the ceramic holder is formed with diametrically disposed keyways or notches for enabling the flat metal terminal to pass therethrough.

The ceramic holders have their shoulders permanently held by a silicone sealant in position against the sheet metal side covers of the heating chamber thus assuring that when a burned out infrared lamp is replaced with a new lamp, the latter has the same precise placement within the heating chamber. Furthermore, the silicone sealing prevents pressurized cover gas within the heating chamber from escaping at this point. Moreover, making the internal diameter of the hollow cylindrical body of the ceramic holder larger in diameter than the quartz tube of the infrared lamp enables a gasket made of a resilient refractory material, such as fibers of alumina, to be firmly packed within the ceramic holder about the end portions of the quartz tube to prevent the pressurized cover gas from escaping at this point.

The inner half portions of the circular holes in the insulation comprising the sidewalls of the heating chamber are formed with a chamfer of forty-five degrees or more. This aids in keeping the adjacent end portions of the quartz tube of the infrared lamp cool by reflecting the infrared rays emitted therefrom back into the interior of the heating chamber. Furthermore, the providing of such a chamfer makes it easier for the terminal end of an infrared lamp which has been inserted through a ceramic holder on one side of the heating chamber to be guided into the ceramic holder on the opposite sidewall thereof.

Accordingly, one of the objects of the present invention is to provide devices especially adapted for mounting the end portions of an infrared lamp in the sidewalls of the heating chamber of an infrared furnace.

Another object of the present invention is to provide for mounting the end portions of each of a plurality of infrared lamps in the sidewalls of the heating chamber of an infrared furnace so that the lamps can be readily individually replaced.

Still another object of the present invention is to provide for replaceably mounting an infrared lamp with the end portions of its quartz tube extending outwardly of and supported in a gastight manner on the sidewalls of the heating chamber of an infrared furnace.

With these and other objects in view, the invention consists in the construction, arrangement, and combination of the various parts of the device, whereby the objects contemplated are attained, as hereinafter set forth, pointed out in the appended claims and illustrated in the accompanying drawings.

BRIEF DESCRIPTION OF THE DRAWINGS

FIG. 2 is an overall perspective view of the heating chamber of the infrared furnace showing some of the ceramic holders in position in the openings provided on the sidewalls thereof;

FIG. 5 is a perspective view showing the end portions of an infrared lamp mounted in the ceramic holders secured on each of the sidewalls of the heating chamber;

FIG. 6 shows the metal terminal on the right end portion of an infrared lamp being moved through the ceramic holder secured on the right sidewall of the heating chamber;

FIG. 7 shows the metal terminal on the right end portion of the infrared lamp being moved out of the ceramic holder secured on the left sidewall of the heating chamber;

FIG. 8 is an enlarged cross sectional view showing the end portion of an infrared lamp mounted in an alternate embodiment of the ceramic holder secured in the sidewall of the heating chamber; and FIG. 9 is an end view of the ceramic holder taken along the line 3—3 of FIG. 8.

DESCRIPTION OF THE PREFERRED EMBODIMENT

Figure 1:
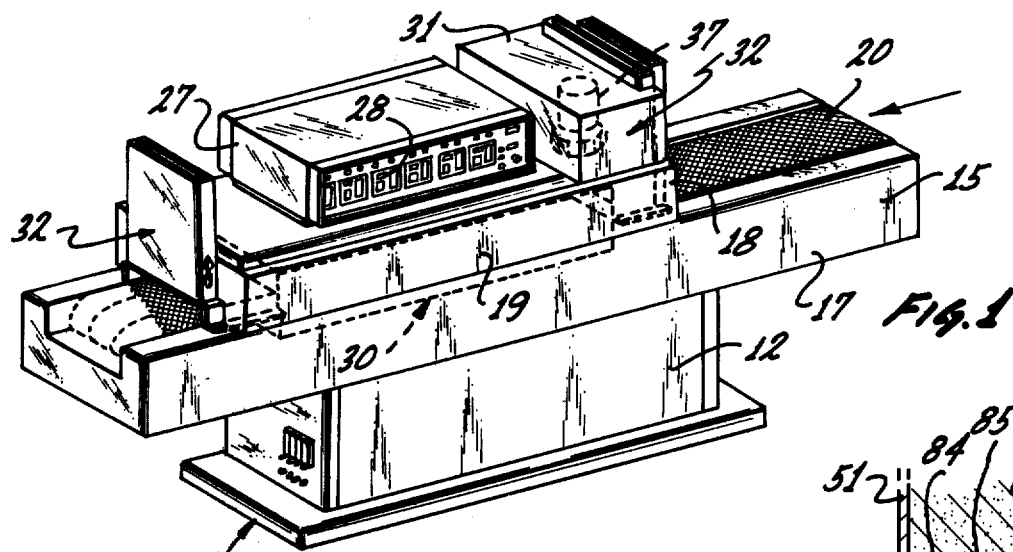
FIG. 1 is an overall perspective view of the infrared furnace utilizing the infrared lamp mounting devices of the present invention.

Referring to FIG. 1 of the drawings, an infrared furnace 10 includes a pedestal 12 having mounted thereon a lower three-dimensional framework 15. Mounted on the top of the lower framework 15 and centered lengthwise thereof is a shorter upper three-dimensional framework 18. A heating chamber 30 is mounted within the upper and lower frameworks 18 and 15. An endless conveyor belt 20 is supported within the lower framework 15 for traveling through the length of the heating chamber 30. The lower framework 15 is provided with removable panels 17 on the front and back thereof. The upper framework 18 is provided with removable panels 19 on the front and back thereof. Baffle units 32 through which the endless conveyor belt 20 passes are provided at the entrance and exit ends of the heating chamber 30. Mounted on the top of the upper framework 18 is a compartment 27 having on the front thereof a panel 28 with electronic controls thereon for controlling the temperature of the different zones along the length of the heating chamber 30. Mounted in a compartment 31 on the side of the compartment 27 is an electric fan 37 for drawing cooling air entering an opening (not shown) in the back of the pedestal 12 past the electronic power units enclosed therein and up past the sidewalls of the heating chamber 30.

Figure 3:
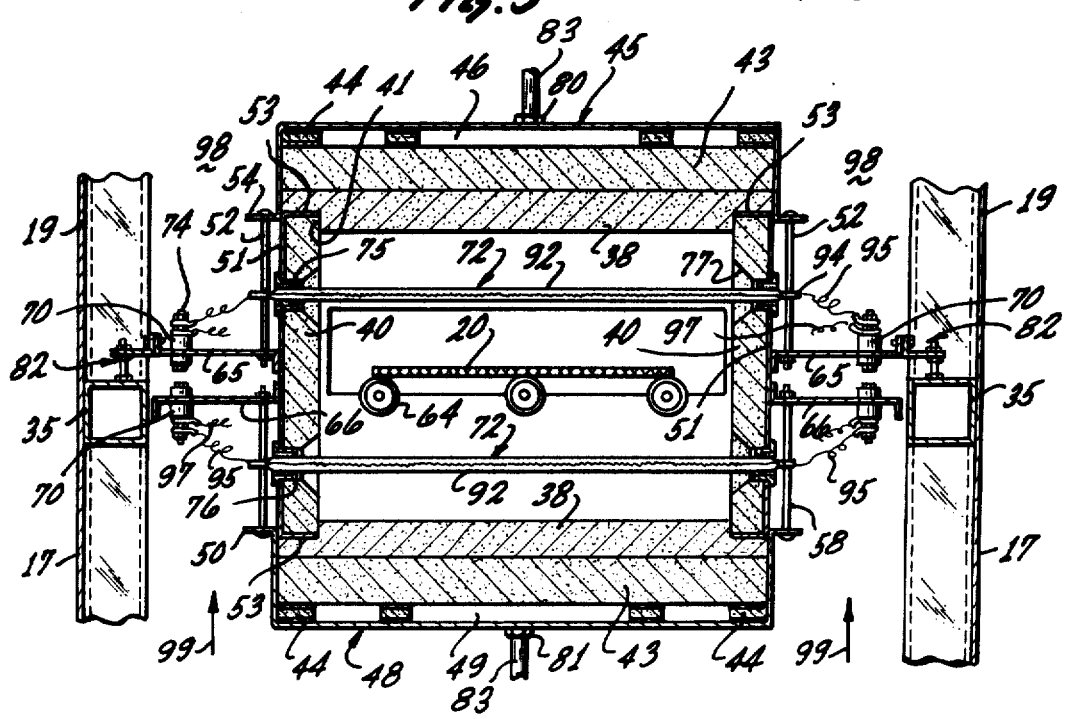
FIG. 3 is a cross sectional view of the heating chamber as taken along line 3—3 of FIG. 2 showing the end portions of the infrared lamps mounted in the sidewalls thereof.

Reference will next be made to an overall perspective view of the heating chamber 30 as illustrated in FIG. 2 and a cross sectional view thereof as illustrated in FIG. 3. The heating chamber 30 is an elongated enclosure having a rectangular cross section. The upper and lower walls of the heating chamber are each constructed of a pair of sheets 38 and 43 of insulation with the ends of the inner sheets 38 having right angled notches 41 thereon. The sidewalls of the heating chamber 30 are constructed of sheets 40 of insulation covered by sheet metal side covers 51. The side covers 51 have flanges on the top and bottom ends thereof which fit in the right angled notches 41 provided on the inner sheets 38 of insulation. The sheets 38, 43 and 40 are formed by compressing a high temperature rated insulating material so that it forms a thick porous structural wall having a relatively smooth surface. A typical insulating material may be composed of seventy-five percent alumina, nineteen percent silica, and six percent of other volatile substances.

As shown in FIG. 3, which is a tranverse section through the heating chamber 30 as taken along line 3—3 of FIG. 3, upper and lower horizontally disposed metal tray members 65 and 66 extend along the full length of each sidewall of heating chamber 30 and are welded to the sheet metal side covers 51 thereof.

A sheet metal top casing or cover 45 provided with bottom flanges 54 fits closely over the upper end portion of the heating chamber 30 with its top inner wall surface contacting edge strips 44 of insulation thereby forming an upper plenum chamber 46. Likewise, a sheet metal bottom casing or cover 48 provided with upper flanges 50 fits closely over the lower end portion of the heating chamber 30 with its bottom inner wall surface contacting edge strips 44 of insulation thereby forming a lower plenum chamber 49.

The top sheet metal cover 45 of the heating chamber 30 is drawn down over the sheet metal side covers 51 and held by tie rods 52 passing through openings in the bottom flanges 54 thereof and aligned openings in the wall of the upper metal tray member 65. Likewise, the bottom sheet metal cover 48 of the heating chamber 30 is drawn up over the sheet metal side covers 51 and held by tie rods 58 passing through openings in the upper flanges 50 thereof and aligned openings in the wall of the lower metal tray member 66. The heating chamber 30 is provided with mounting brackets 82 at its four corners. The brackets 82 are attached to the upper tray member 65 and are connected to support the heating chamber 30 on the common structural member 35 provided for the lower and upper frameworks 15 and 18.

The endless conveyor belt 20 is supported to ride within the heating chamber 30 on three quartz tubes 64 which extend throughout the length of the heating chamber 30. The ends of the quartz tubes 64 rest on semi-circular grooves 39 provided on the upper edge of the lower insulating member 56 forming the end walls of the heating chamber 30.

Each of the sidewalls of the heating chamber is provided with an upper series of spaced circular holes 75 above the conveyor belt 20 and a lower series of spaced circular holes 76 below the conveyor belt 20. Each of the circular holes 75 and 76 extend through the sheet metal side covers 51 and the sheet 40 of insulation forming each of the sidewalls. The inner half portions of each of the holes 75 and 76 in the sheet 40 of insulation is provided with a forty-five degree chamfer 77.

A mounting device in the form of a ceramic holder 84 is positioned in each of the circular holes 75 and 76. Each ceramic holder has a hollow cylindrical body 85 with a shoulder 87 on the outer end thereof and a bottom wall 88 on the inner end thereof. The bottom 88 is provided with a concentric circular opening 89 and a pair of diametrically disposed keyways or notches 90. The length of the body 85 of the ceramic holder 84 is approximately one-half the thickness of the side sheets 40 of insulation.

Each ceramic holder 84 is positioned with its cylindrical body 85 having a relatively close fit in one of the circular holes 75 or 76 on the sidewalls and with the shoulder 87 thereof lying against the sheet metal side cover 51 and permanently sealed in position by use of a silicone sealant 91.

An infrared lamp 72 is mounted with its end portions passing through the circular openings 89 in opposing ceramic holders 84 secured on the sidewalls of the heating chamber 30. Each infrared lamp 72 comprises a transparent or translucent elongated quartz tube 92 in the center of which is located an electrically heated infrared ray emitting filament 93 which is preferably made of tungsten. The ends of the quartz tube 92 are provided with generally rectangularly shaped flat metal terminals 94 which connect to the respective ends of the tungsten filament 93. The metal terminals are a little wider than the diameter of the quartz tube 92 of the infrared lamp 72. Leads 95 are connected to each metal terminal 94.

To mount an infrared lamp 72 in a pair of the ceramic holders 84 provided in the upper holes 75 on the sidewalls of the heating chamber 30, the metal terminal 94 on one end of the infrared lamp 72 is inserted into the ceramic holder 84 secured in hole 75 on one of the sidewalls. The infrared lamp 72 is then rotated, as needed, such that its metal terminal 94 passes through the notches 90 on the bottom wall 88 of the ceramic holder. The quartz tube 92 of the infrared lamp 72 is then pushed through the circular opening 89 in the bottom wall 88 of the ceramic holder 84 until the metal terminal 94 reaches the opposing hole 75 in the opposite sidewall. The chamfer 77 on the inner portion of the hole 75 aids in guiding the metal terminal 94 into the hole. Rotation of the infrared lamp then enables the metal terminal 94 to slide through the notches 90 in the bottom wall 88 of the ceramic holder 84 on this opposite sidewall such that the end portions of the infrared lamp 72 protrude outwardly from each of the ceramic holders 84. A gasket 96 formed of resilient refractory material, such as alumina fiber, and in the shape of a short tube, is then fitted over the metal terminal 94 on each end of the infrared lamp 72 and packed tightly within the ceramic holder 84. It may be desirable in some cases to apply a silicon sealant 79 on the outer end of the cylindrical opening of the ceramic holder 84 to provide further sealing.

It may be desirable in other cases to saturate the short tube-like alumina gasket 96 in a solution of soluble refractory material such as sodium silicate just prior to inserting it over the metal terminal 94 on the end of the infrared lamp 72 and packing it into the cavity of the ceramic holder 84 around the quartz tube 92. Upon drying, the alumina gasket 96 is effectively bonded to the wall of the ceramic holder 84 and the wall of the quartz tube 92 of the infrared lamp 72. This assures that the alumina gasket 96 does not work loose in the ceramic holder 84 as a result of the expansion and contraction of the sidewalls of the heating chamber 30 and that the joint will remain gastight.

It should now be clearly understood that an infrared lamp 72 is thus transversely disposed in each of the opposing pairs of upper and lower holes 75 and 76 in the sidewalls of heating chamber 30 with its flat metal terminals 94 protruding outside each of the sheet metal side covers 51.

As shown in FIG. 3, the upper and lower tray members 65 and 66 attached on the sidewalls of the heating chamber 30 each have a series of spaced ceramic posts 70 mounted along the length thereof corresponding to the upper and lower series of spaced holes 75 and 76 in the sidewalls of the heating chamber 30. The metal contacts 74 on the ends of the ceramic posts 70 have connected thereto the ends of the leads 95 on the metal terminals 94 of the associated infrared lamp 72. Each metal contact 74 on the ceramic post 70 is connected, in turn, by a lead 97 to the power circuits within the pedestal 12 and the control panel 28.

A cover gas which may be nitrogen or oxygen, for example, may be fed under a light pressure by way of tubes 79 to connectors 80 and 81 on the respective top and bottom plenum chambers 46 and 49 on the heating chamber 30, as illustrated in FIGS. 2 and 3. The cover gas slowly and evenly filters through the porous sheets 43 and 38 of insulation which form each of the top and bottom walls of the heating chamber 30 thus causing the interior of the heating chamber to be at a slightly higher pressure than the atmosphere surrounding the infrared furnace. It is for this reason that the ceramic holder 84 is provided with a silicone sealant 91 on its should 87 to prevent cover gas in the heating chamber 30 from escaping at these points and the alumina gasket 96 is provided within each of the ceramic holders 84 to seal off the openings 89 in the bottom walls 88 thereof through which the end portions of the quartz tube 92 of the infrared lamp 72 pass.

As illustrated in FIG. 3, the upper and lower metal tray members 65 and 66 provide for holding the leads 95 and 97 spaced away from the sidewalls of the heating chamber 30. Thus, with the front and back upper and lower panels 17 and 19 in position on the respective lower and upper frameworks 15 and 18, vertical passageways 90 are formed on the longitudinal sides of the heating chamber 30 through which fan 37 can draw cooling air, as indicated by arrows 99, to cool the leads 95 and 97 and the metal terminals 94 of the infrared lamps 72.

It should be noted that, if were it not for the silicone sealant 91 on the shoulders 87 of the ceramic holders 84 and the alumina gaskets 96 on the end portions of the lamp 72, the cooling air moving past the protruding end portions of the infrared lamp 72 could possibly seep through holes 75 or 76 on the sidewalls, contaminating the atmosphere within the heating chamber.

It should be especially noted that the bottom wall 83 of the ceramic holder 84 provides for retaining the alumina gasket 96 so that it will not be accidentially pushed into the interior of the heating chamber 30 when the infrared lamp 72 is being inserted or removed from its mounting in the sidewalls of the heating chamber 30.

When an infrared lamp 72 burns out and is to be replaced, the leads 95 connected to the metal terminals 94 on each end thereof are disconnected from the metal contacts 74 on the ends of the ceramic posts 70 provided on the tray members 65 or 66. As illustrated in FIG. 6, the resilient alumina gaskets 96 are then removed from the ceramic holders 94 on each of the sidewalls of the heating chamber 30. The infrared lamp 72 is then rotated, as needed, by use of the protruding opposite left end thereof such that the right metal terminal 94 can slide through the notches 90 on the bottom wall 88 of the ceramic holder 84 on the right sidewall. Continued pulling of the left end of the infrared lamp 72 then causes the metal terminal 94 of the right end thereof to be passed through the notches 90 of the ceramic holder 84 on the left sidewall, as illustrated in FIG. 7.

It should be now clear that each infrared lamp 72 in the heating chamber 30 is readily individually serviceable and replaceable without the disconnection of or disturbance of any of the other lamps. Furthermore, the close fit of the ceramic holders 84 in the holes 75 and 76 in the sidewalls of the heating chamber 30 and the securing of the shoulders 87 thereof on the sheet metal covers 51 not only give support to the ceramic holders 84 but provide for a precise replacement of the infrared lamps 72 in the heating chamber 30. Moreover, the ceramic holders 84 serve as a barrier to protect the metal terminals 94 from the heat of the heating chamber.

Figure 4:
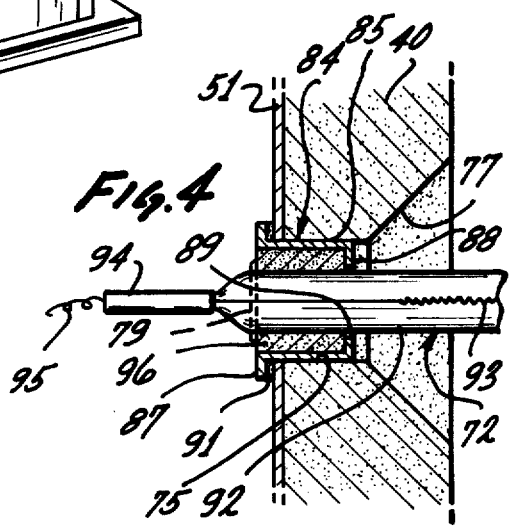
FIG. 4 is an enlarged cross sectional view showing the end portion of an infrared lamp mounted in the ceramic holder secured in the sidewall of the heating chamber.

An alternate embodiment of a ceramic holder 100 is shown in FIGS. 8 and 9. The ceramic holder 100 is shaped similarly to the ceramic holder 84 shown in FIG. 4 with the exception that the holder 100 is provided with an internal concentric recess 101 on the outer end of the cylindrical body 102 thereof. Each of the ceramic holders 100 is inserted in a hole 75 or 76 in the sidewall of the heating chamber 30 with its shoulder 104 cemented by a silicone sealant 105 to the sheet metal side cover 51 of the heating chamber 30. An infrared lamp 72 is then inserted such that its end portions extend through respective opposing ceramic holders 100. A gasket 106 of alumina fiber is then fitted over each of the end metal terminals 94 of the infrared lamp 72 and tightly packed into the cavity of the ceramic holder 100 around the quartz tube 92. A circular ceramic end cover 103 having a concentric opening 107 with diametrically opposing keyways or notches 108 (see FIG. 9) thereon is then positioned over the metal terminal 94 of the infrared lamp 72 with its concentric opening 107 fitted closely about the quartz tube 92 of the infrared lamp 72. The ceramic end cover 103 has its inner surface wetted with a sodium silicate solution which upon drying provides for effectively cementing the end cover 103 within the internal circular recess 101 of the ceramic holder 100. Note that the end cover 103 serves to retain the alumina gasket 106 tightly packed within the cavity of the ceramic holder 100 and, together with the bottom wall 109, prevents the gasket 106, from working loose with the contraction and expansion of the sidewalls resulting from the heating and cooling of the chamber 30.

While the invention has been concerned with a particular embodiment, it is to be understood that many modifications and variations in the construction and arrangement thereof may be provided for without departing from the spirit and scope of the invention or sacrificing any of its advantages. The invention is, therefore, considered as including all such possible modifications and variations coming within the legitimate and valid scope of the appended claims.

What is claimed is:

1. In an infrared furnace:
   an elongated heating chamber having sidewalls formed of insulation with sheet metal covers on the outer surfaces thereof;
   an endless conveyor belt supported for movement through said heating chamber;
   a plurality of pairs of opposing circular holes provided in the sidewalls above and below said endless conveyor belt, the inner half portions of each of the holes in the insulation provided with a chamfer;
   a plurality of ceramic holders, each having a hollow cylindrical body, said body provided with a shoulder on the outer end thereof and a bottom wall on the inner end thereof having a concentric circular opening with diametrically disposed notches;
   each ceramic holder having its body positioned with a close fit in one of said circular holes on the sidewalls with its shoulder secured by sealant to said sheet metal cover;
   a plurality of infrared lamps, each comprising a quartz tube having an infrared emitter extending axially therethrough and flat metal terminals on the ends thereof, the width of said terminals being greater than the diameter of said quartz tube;
   each said infrared lamp transversely disposed within said heating chamber with the end portions of its quartz tube respectively extending with a close fit through the circular openings in the bottom walls of the ceramic holders on the opposite sidewalls of said heating chamber with the metal terminals protruding outside the sheet metal covers thereof; and
   a gasket made of a resilient refractory material disposed on each end portion of said quartz tube and tightly packed within the hollow cylindrical body of said ceramic holder around the end portions of the quartz tube.

2. In an infrared furnace as defined in claim 1 wherein said sidewalls are formed of an insulation material including alumina and silica.

3. In an infrared furnace as defined in claim 1 wherein said chamfer is formed at an angle of forty-five degrees or more.

4. In an infrared furnace as defined in claim 1 wherein said gasket is saturated with a solution of soluble refractory material prior to being packed within the hollow cylindrical body of said ceramic holder.

5. In an infrared furnace as defined in claim 1 wherein said soluble refractory material is sodium silicate.

6. In an infrared furnace as defined in claim 1 wherein the outer end of said body is provided with a concentric recess; and a ceramic end cover having a concentric opening with diametrically opposed notches is positioned over the metal terminal on the end of said infrared lamp and cemented in said recess.

7. In an infrared furnace as defined in claim 1 wherein a coating of silicone sealant is provided on the outer end of said gasket packed around the quartz tube of the infrared lamp.

8. An infrared furnace comprising:
   a heating chamber having sidewalls formed of insulation material, the sidewalls having a plurality of opposing, lamp receiving holes;
   a plurality of infrared lamps each comprising a tubular envelope with electrical end terminals; and
   means for mounting said infrared lamps to extend across the interior of said heating chamber from one sidewall to the other thereof;
   said means for mounting said infrared lamps comprising:
   a plurality of ceramic holders, each ceramic holder having a hollow body and a bottom wall on the inner end thereof, said bottom wall having an opening;
   each said ceramic holder having its body positioned in one of the holes in the sidewalls with its bottom wall oriented toward the interior of the chamber;
   each said infrared lamp extending across the interior of said heating chamber from one sidewall to the other thereof with its end portions passing through the openings of an opposing pair of ceramic holders with the terminals protruding therefrom outside of the chamber; and
   a plurality of gaskets, each gasket formed of a resilient refractory material and positioned over an end portion of an infrared lamp and tightly packed within the hollow cylindrical body of a ceramic holder to provide a seal for the end portion of the lamp.

9. The furnace of claim 8, in which the lamp-receiving holes are chamfered on the interior of the chamber.

10. The furnace of claim 9, in which the chamfer is 45 degrees.

11. The furnace of claim 8, in which the body of each ceramic holder has a shoulder in abutment with the outer surface of the heating chamber.

12. The furnace of claim 11, additionally comprising a sealing material between the flange and the outer surface of the heating chamber.

13. The furnace of claim 8, in which the envelope of each lamp has a given diameter, the end terminals of each lamp are wider than the given diameter, and the opening in the bottom wall of each ceramic holder is in the shape of a circle with diametrically disposed notches therein, the openings being so dimensioned that the diameter of the circle is slightly larger than the given diameter and smaller than the width of the terminals of the lamps, while the distance between the notches is slightly larger than the width of the terminals of the lamps.

* * * * *